(12) United States Patent
Vogeley

(10) Patent No.: US 7,498,718 B2
(45) Date of Patent: Mar. 3, 2009

(54) STACKED PIEZOELECTRIC DIAPHRAGM MEMBERS

(75) Inventor: James Vogeley, Yorktown, VA (US)

(73) Assignee: Adaptivenergy, LLC., Hampton, VA (US)

( * ) Notice: Subject to any disclaimer, the term of this patent is extended or adjusted under 35 U.S.C. 154(b) by 12 days.

(21) Appl. No.: 11/548,117

(22) Filed: Oct. 10, 2006

(65) Prior Publication Data

US 2007/0243084 A1    Oct. 18, 2007

Related U.S. Application Data

(63) Continuation-in-part of application No. 11/104,669, filed on Apr. 13, 2005.

(51) Int. Cl.
*H01L 41/08* (2006.01)

(52) U.S. Cl. .................. 310/324; 310/328
(58) Field of Classification Search .......... 310/324, 310/328, 333, 344
See application file for complete search history.

(56) References Cited

U.S. PATENT DOCUMENTS

| | | | |
|---|---|---|---|
| 2,328,805 A | 9/1943 | Holthouse | |
| 2,829,860 A | 4/1958 | Garner et al. | |
| 2,901,623 A | 8/1959 | Wouters | |
| 2,928,409 A * | 3/1960 | Johnson et al. | 137/82 |
| 3,107,630 A * | 10/1963 | Johnson et al. | 417/322 |
| 3,370,187 A * | 2/1968 | Straube | 310/330 |
| 3,520,641 A * | 7/1970 | Casey | 417/412 |
| 3,719,939 A * | 3/1973 | Geil et al. | 340/626 |
| 3,936,342 A | 2/1976 | Matsubara et al. | |
| 4,034,780 A | 7/1977 | Horvath | |
| 4,095,615 A | 6/1978 | Ramsauer | |
| 4,629,926 A | 12/1986 | Siegal | |
| 4,826,131 A | 5/1989 | Mikkor | |
| 4,859,530 A | 8/1989 | Roark et al. | |
| 4,939,405 A | 7/1990 | Okuyama et al. | |
| 5,029,805 A | 7/1991 | Albarda et al. | |
| 5,049,421 A | 9/1991 | Kosh | |
| 5,055,733 A * | 10/1991 | Eylman | 310/328 |
| 5,084,345 A | 1/1992 | Manos | |
| 5,192,197 A * | 3/1993 | Culp | 417/322 |

(Continued)

FOREIGN PATENT DOCUMENTS

EP    0 202 836 A1    11/1986

(Continued)

OTHER PUBLICATIONS

IBM Technical Disclosure Bulletin; Piezoelecto-Hydraulic Print Actuator; Feb. 1, 1986; IBM; vol. 28; Issue No. 9; p. 4164.*

(Continued)

*Primary Examiner*—Thomas M Dougherty
(74) *Attorney, Agent, or Firm*—Nixon & Vanderhye, P.C.

(57) ABSTRACT

A diaphragm assembly (20) comprises at least two piezoelectric diaphragm members (22) arranged in a stacking direction (23). An interface layer (24) is situated between adjacent piezoelectric diaphragm members (22). The interface layer (24) in the stacking direction (23) is displaceable and incompressible or resilient. The interface layer (24) permits lateral movement of the adjacent piezoelectric diaphragm members (22) relative to the interface layer (24) in a direction perpendicular to the stacking direction (23). The interface layer (24) can comprise, for example, an incompressible liquid or a semi-liquid or a compressible gas. A gasket (26) can be used to seal the substance in the interface layer if necessary.

26 Claims, 2 Drawing Sheets

U.S. PATENT DOCUMENTS

| | | | |
|---|---|---|---|
| 5,238,223 | A | 8/1993 | Meltner et al. |
| 5,245,734 | A | 9/1993 | Isartel |
| 5,271,724 | A | 12/1993 | van Lintel |
| 5,338,164 | A | 8/1994 | Sutton et al. |
| 5,354,032 | A | 10/1994 | Sims et al. |
| 5,471,721 | A | 12/1995 | Haertling |
| 5,481,152 | A * | 1/1996 | Buschulte .................. 310/328 |
| 5,632,841 | A | 5/1997 | Hellbaum et al. |
| 5,759,015 | A | 6/1998 | van Lintel et al. |
| 5,779,218 | A | 7/1998 | Kowanz |
| 5,785,295 | A | 7/1998 | Tsai |
| 5,849,125 | A | 12/1998 | Clark |
| 5,876,187 | A | 3/1999 | Afromowitz et al. |
| 5,885,222 | A * | 3/1999 | Kassal et al. ................ 600/528 |
| 5,939,640 | A * | 8/1999 | Hauser ....................... 73/727 |
| 5,945,768 | A | 8/1999 | Treu, Jr. |
| 6,033,191 | A | 3/2000 | Kamper et al. |
| 6,042,345 | A | 3/2000 | Bishop et al. |
| 6,043,924 | A * | 3/2000 | Montgomery et al. ....... 359/285 |
| 6,060,811 | A | 5/2000 | Fox et al. |
| 6,071,087 | A | 6/2000 | Jalink, Jr. et al. |
| 6,071,088 | A | 6/2000 | Bishop et al. |
| 6,095,175 | A | 8/2000 | Miller et al. |
| 6,104,127 | A | 8/2000 | Kameyama et al. |
| 6,109,889 | A | 8/2000 | Zengerle et al. |
| 6,162,313 | A | 12/2000 | Bansemir et al. |
| 6,179,584 | B1 | 1/2001 | Howitz et al. |
| 6,189,858 | B1 | 2/2001 | Miyazoe et al. |
| 6,213,735 | B1 | 4/2001 | Henco et al. |
| 6,215,228 | B1 | 4/2001 | Yamazaki |
| 6,227,809 | B1 | 5/2001 | Forster et al. |
| 6,227,824 | B1 | 5/2001 | Stehr |
| 6,439,539 | B1 | 8/2002 | Powell |
| 6,490,881 | B1 * | 12/2002 | Sinclair et al. ................ 62/467 |
| 6,666,127 | B2 * | 12/2003 | Peles ............................ 92/50 |
| 2003/0201416 | A1 * | 10/2003 | Miles ........................ 251/61.2 |
| 2004/0000843 | A1 * | 1/2004 | East ........................... 310/331 |
| 2004/0021398 | A1 | 2/2004 | East |
| 2004/0037708 | A1 * | 2/2004 | Murasato et al. .............. 417/99 |
| 2006/0087202 | A1 * | 4/2006 | Flaemig-Vetter et al. .... 310/344 |
| 2006/0232166 | A1 * | 10/2006 | Vogeley ...................... 310/324 |

FOREIGN PATENT DOCUMENTS

| | | | |
|---|---|---|---|
| GB | 2 013 311 | A | 8/1979 |
| GB | 2 161 902 | A | 1/1986 |
| GB | 2 250 911 | A | 6/1992 |
| GB | 2 262 972 | A | 7/1993 |
| JP | 4-121462 | * | 4/1992 |
| WO | 87/07218 | | 12/1987 |
| WO | 99/31420 | | 6/1999 |
| WO | 99/61827 | A1 | 12/1999 |
| WO | 01/04526 | A1 | 1/2001 |
| WO | 02/22358 | | 3/2002 |

OTHER PUBLICATIONS

U.S. Office Action mailed Feb. 23, 2007 from co-pending U.S. Appl. No. 11/104,669.

International Search Report mailed Jan. 24, 2002 in corresponding PCT Application No. PCT/US01/28947.

GB Examination Report mailed Jun. 4, 2004 in corresponding GB application No. GB0308623.8.

GB Examination Report mailed Nov. 9, 2004 in corresponding GB application No. GB0423682.4.

International Search Report and Written Opinion mailed Sep. 14, 2006 in corresponding PCT application No. PCT/US04/07979.

International Preliminary Report on Patentability mailed Nov. 2, 2006 in corresponding PCT application No. PCT/US2004/007979.

International Preliminary Examination Report mailed Oct. 3, 2002 in corresponding PCT Application PCT/US01/28947.

U.S. Final Office Action mailed Dec. 14, 2007 from co-pending U.S. Appl. No. 11/104,669.

* cited by examiner

STACKED PIEZOELECTRIC DIAPHRAGM MEMBERS

This application is a continuation-in-part of U.S. patent application Ser. No. 11/104,669 filed Apr. 13, 2005, entitled "Stacked Piezoelectric Diaphragm Members", which is incorporated herein by reference.

BACKGROUND

1. Field of the Invention

The present invention pertains to piezoelectric diaphragms, and particularly to a piezoelectric diaphragm assembly with stacked diaphragms and/or a pump incorporating the same.

2. Related Art and Other Considerations

A piezoelectric material is permanently-polarized and will produce an electric field when the material changes dimensions as a result of an imposed mechanical force. This phenomenon is known as the piezoelectric effect.

Layers of piezoelectric material can be stacked to form a multiple layer piezoelectric device. For example, U.S. Pat. No. 6,215,228 to Yamazaki discloses stacking multiple piezoelectric layers and multiple internal electrodes. U.S. Pat. No. 5,245,734 to Issartel discloses stacking and pressing alternating layers of piezoceramic material and interdigital electrode material. Issartel also discloses boundary discontinuities within the electrode structure which form areas in which electrode edges do not make contact with the common electrical collectors of the piezoactuators and in which the piezoceramic layers are prevented from touching one another.

Examples of piezoelectric diaphragms and pumps incorporating the same are described and shown in PCT Patent Application PCT/US01/28947, filed Sep. 14, 2001; U.S. patent application Ser. No. 10/380,547, filed May 28, 2003, entitled "Piezoelectric Actuator and Pump Using Same"; U.S. patent application Ser. No. 10/388,589, filed Mar. 17, 2003, entitled "Piezoelectric Actuator and Pump Using Same", and U.S. Provisional Patent Application 60/670,692, filed Apr. 13, 2005, entitled "PIEZOELECTRIC DIAPHRAGM ASSEMBLY WITH CONDUCTORS ON FLEXIBLE FILM", all of which are incorporated herein by reference.

One challenge in piezoelectric diaphragm technology is to obtain not only responsiveness to an applied electrical signal, but also a sufficient force as exerted through the piezoelectric diaphragm for acting upon a medium such as a fluid, for example. What is needed, therefore, and an object of the technology disclosed herein, is a piezoelectric diaphragm assembly which provides enhanced force.

BRIEF SUMMARY

A diaphragm assembly comprises at least two piezoelectric diaphragm members arranged in a stacking direction. An interface layer is situated between adjacent piezoelectric diaphragm members.

In one example embodiment the interface layer in the stacking direction is displaceable but incompressible. The interface layer permits lateral movement of the adjacent piezoelectric diaphragm members relative to the interface layer in a direction perpendicular to the stacking direction. The incompressible interface layer can comprise, for example, an incompressible liquid or a semi-liquid. In another embodiment the interface layer can be a plastic film, such as a plastic film disk, for example.

In another example embodiment, the interface layer comprises a compressible gas whose volume is chosen to produce a desired spring constant of the resulting gas spring. The interface layer of such example embodiment is therefore resilient.

A gasket can be used to seal the substance in the interface layer if necessary. When, for example, the interface layer is incompressible, the force applied by the displacement of a piezoelectric diaphragm member on a first side of an interface layer is essentially totally transmitted by the interface layer to another piezoelectric diaphragm member on a second side of the interface layer. As a result, when activated the stacked piezoelectric diaphragm members yield roughly the sum total of the forces of the individual piezoelectric diaphragm members bi-directionally and with minimum loss.

The diaphragm assembly can be advantageously employed in many applications and devices, such as pumps, compressors, valve actuators, and the like

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION OF THE DRAWINGS

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well-known devices, circuits, and methods are omitted so as not to obscure the description of the present invention with unnecessary detail. Moreover, individual function blocks are shown in some of the figures.

Figure 1:
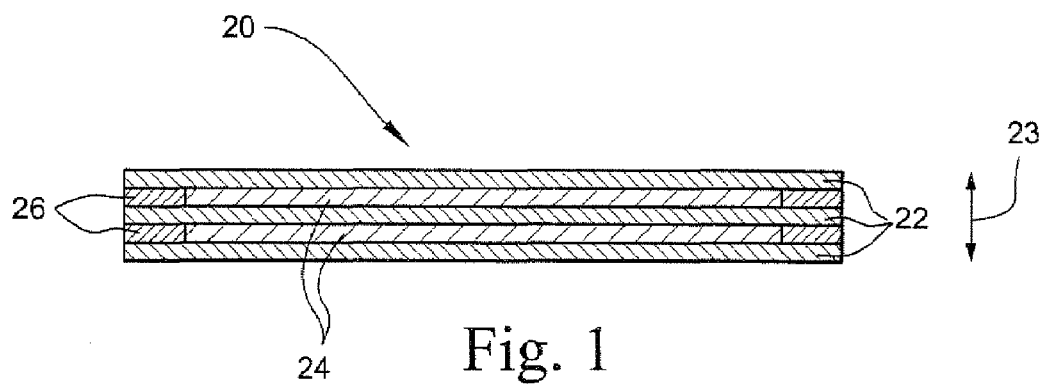
FIG. 1 is a vertical cross section view of an example embodiment of a piezoelectric diaphragm assembly.
Figure 3:
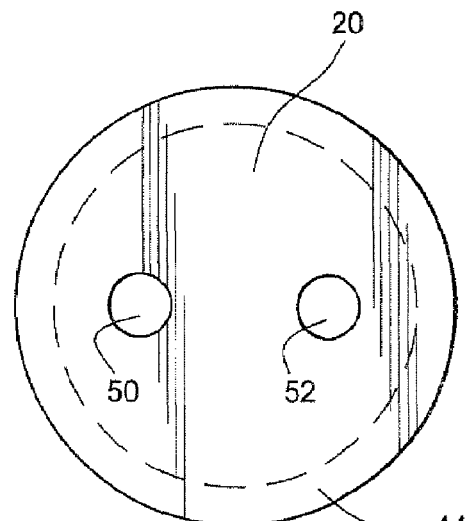
FIG. 3 is a top view of the pump of FIG. 2.

FIG. 1 shows a cross section of diaphragm assembly 20 capable of applying high force bidirectionally. The diaphragm assembly 20 comprises at least two stacked piezoelectric diaphragm members 22 arranged in a stacking direction. The stacking direction, depicted by arrow 23, is essentially parallel to the thickness of each piezoelectric diaphragm member 22. If the piezoelectric diaphragm members 22 were considered as lying in planes, then the stacking direction 23 would be essentially perpendicular to the plane of each piezoelectric diaphragm member 22. In some embodiments, however, the piezoelectric diaphragm members 22 may be slightly domed due either to formation techniques or structural repercussions thereof. In any event, the stacking direction 23 is understood to be along the smallest dimension of the piezoelectric diaphragm members 22.

The particular example, non-limiting embodiment of diaphragm assembly 20 illustrated in FIG. 1 happens to comprise three piezoelectric diaphragm members 22. A lesser (two) or greater number of piezoelectric diaphragm members 22 may be provided in other embodiments. However, as the stack grows to a greater number of piezoelectric diaphragm members 22, the mass of the stack will increase and its mechanical properties may change (stiffness, springiness, dampening from the interface, etc.). These factors may affect speed and displacement at which the stack can be driven.

A degree of curvature of the piezoelectric diaphragm members 22 (relative to stacking direction 23) changes in accordance with applied voltage. For example, in the absence of an electrical signal or voltage, the piezoelectric diaphragm members 22 may have a relatively flat or slightly curved configuration as shown in FIG. 1. On the other hand, when a voltage is applied, the degree of curvature of the piezoelectric diaphragm members 22 increases, so that the centers of the piezoelectric diaphragm members 22 displace or flex more prominently in the stacking direction 23.

FIG. 1 further shows that an interface layer 24 is situated between each adjacent piezoelectric diaphragm members 22. In one example implementation of FIG. 1, each interface layer 24 is, in the stacking direction 23, displaceable but incompressible. That is, each interface layer 24 can, in response to flexure or displacement of its adjacent piezoelectric diaphragm members 22, also flex or displace in the stacking direction 23. Yet due to the incompressible nature of each interface layer 24, the force applied by the displacement of a piezoelectric diaphragm member 22 on a first side of an interface layer 24 is essentially totally transmitted by the interface layer 24 to another piezoelectric diaphragm member 22 on a second side of the interface layer 24.

Advantageously, while each interface layer 24 is incompressible for the first example implementation, the interface layer 24 also permits lateral movement of the adjacent piezoelectric diaphragm members 22 relative to the interface layer. Such lateral movement is in a direction perpendicular to the stacking direction 23, e.g., along the surfaces of piezoelectric diaphragm members 22 which contact the interface layer 24. In other words, the interface layer 24 is not adhered or bonded to its adjacent piezoelectric diaphragm members 22, but rather the adjacent piezoelectric diaphragm members 22 can slip laterally with respect to the interface layer 24. By allowing such slippage, the interface layer 24 does not dampen or impede the displacement of the piezoelectric diaphragm members 22 when the piezoelectric diaphragm members 22 are activated by application of a voltage, for example.

Each interface layer 24 is preferably air-tight. The interface layer 24 can, in some example embodiments, comprise an incompressible substance. For example, in one example embodiment, the incompressible substance of interface layer 24 comprises a liquid. In another example embodiment, the incompressible substance of interface layer 24 comprises a semi-liquid such as cured Room Temperature Vulcanizing (RTV) silicone adhesive. RTV is a common liquid adhesive that cures to a rubber-like semi-solid. Any material can serve as interface layer 24 provided that it is incompressible and can flow to some extent. Incompressibility provides bidirectionality benefits, and inexpandability. Most liquids, oils, greases, etc., can serve as the interface layer 24, although materials with a low vapor pressure should be avoided as they may cause cavitation in the layer when a negative pressure occurs (as in the suction stroke of a pump, for example). Materials that can be laminated can also serve as the interface layer 24 and can be laminated into the stack rather than glued or assembled.

In another example embodiment, the interface layer 24 comprises a compressible gas whose volume is chosen to produce a desired spring constant of the resulting gas spring. The interface layer of such example embodiment is therefore resilient. For example, air can be used as the interface layer 24. Alternatively, any gas can be used. Different gases require different volumes to obtain an equivalent spring constant for the resulting gas spring.

When interface layer 24 comprises a gas, a liquid or some semi-liquids, a gasket 26 may be required at edges of peripheries of the diaphragm assembly 20 to seal the liquid or semi-liquid in the respective interface layer. FIG. 1 shows an illustrative embodiment where gaskets 26 are required. Many flexible adhesives/sealants such as silicones (e.g., RTV), urethanes, epoxies, etc., can serve as the interface layer 24, and in so doing can eliminate the need for gaskets 26 and also allow for realizing stacks as standalone units or actuators (without the need for something like a pump housing to hold together a stack comprising the piezoelectric diaphragm members, the interface layers, and gaskets). Thus, gaskets may not be required for some incompressible substances (e.g., RTV sealant), and therefore can be omitted.

The thickness of the interface layer 24 can be a function of viscosity and mass of the interface material. For example, a very low viscosity, low-mass liquid and a lightweight oil can afford a much thinner interface than a silicone adhesive or laminating material. For adhesives and laminates that comprise the interface layer 24, such adhesive interface layer or lamination interface layer should be dimensionally thick enough and flexible enough to allow for a certain degree of perpendicular movement (perpendicular to the stacking direction of the piezoelectric elements). Conceptually such adhesive interface layer or lamination interface layer can be considered as if they were very thick fluids. While the adhesive or sealant or flowable lamination layer may restrict the perpendicular movement more than a less viscous medium such as oil, such layers do have offsetting advantages such as easier manufacturability.

In one example, non-limiting embodiment, each piezoelectric diaphragm member 22 comprises a piezoelectric material or core which is laminated between a metal substrate layer and an outer metal layer. In the lamination process, an adhesive bonding is employed to laminate the metal layers to the piezoelectric core. The metal substrate layer can be comprised of stainless steel and the outer metal layer can be comprised of aluminum. It would be apparent to one skilled in the art that other materials could be used for the enclosing layers. The structure and fabrication of such an example piezoelectric diaphragm member is understood with reference to, e.g., one or more of PCT Patent Application PCT/US01/28947, filed Sep. 14, 2001; U.S. patent application Ser. No. 10/380,547, filed May 28, 2003, entitled "Piezoelectric Actuator and Pump Using Same"; U.S. patent application Ser. No. 10/388,589, filed Mar. 17, 2003, entitled "Piezoelectric Actuator and Pump Using Same", and simultaneously filed U.S. Provisional Patent Application 60/670,692, filed Apr. 13, 2005, entitled "PIEZOELECTRIC DIAPHRAGM ASSEMBLY WITH CONDUCTORS ON FLEXIBLE FILM", all of which are incorporated herein by reference.

The interface layer 24 mechanically locks adjacent piezoelectric diaphragm members 22 together longitudinally (e.g., in the stacking direction 23). To yield maximum value, such locking is preferably bidirectional in the stacking direction 23. However, the piezoelectric diaphragm members 22 are still free to move against each other laterally. Such lateral freedom may avoid, for example, any lamination stiffness in an embodiment in which the piezoelectric diaphragm members 22 are laminated. The air-tight nature of the interface layer 24 yields bidirectional, longitudinal mechanical rigidity yet allows for the slight lateral movement (advantageous for avoiding lamination stiffness). As a result, when activated the stacked piezoelectric diaphragm members 22 yield roughly or approximately the sum total of the forces of the individual piezoelectric diaphragm members 22 bi-directionally and with minimum loss, e.g., minimum loss in terms of mass, friction, or flowability of the in interface layer.

A diaphragm assembly 20 such as that of FIG. 1 can be advantageously employed in many applications and devices, such as pumps, compressors, valve actuators, and the like.

Figure 2:
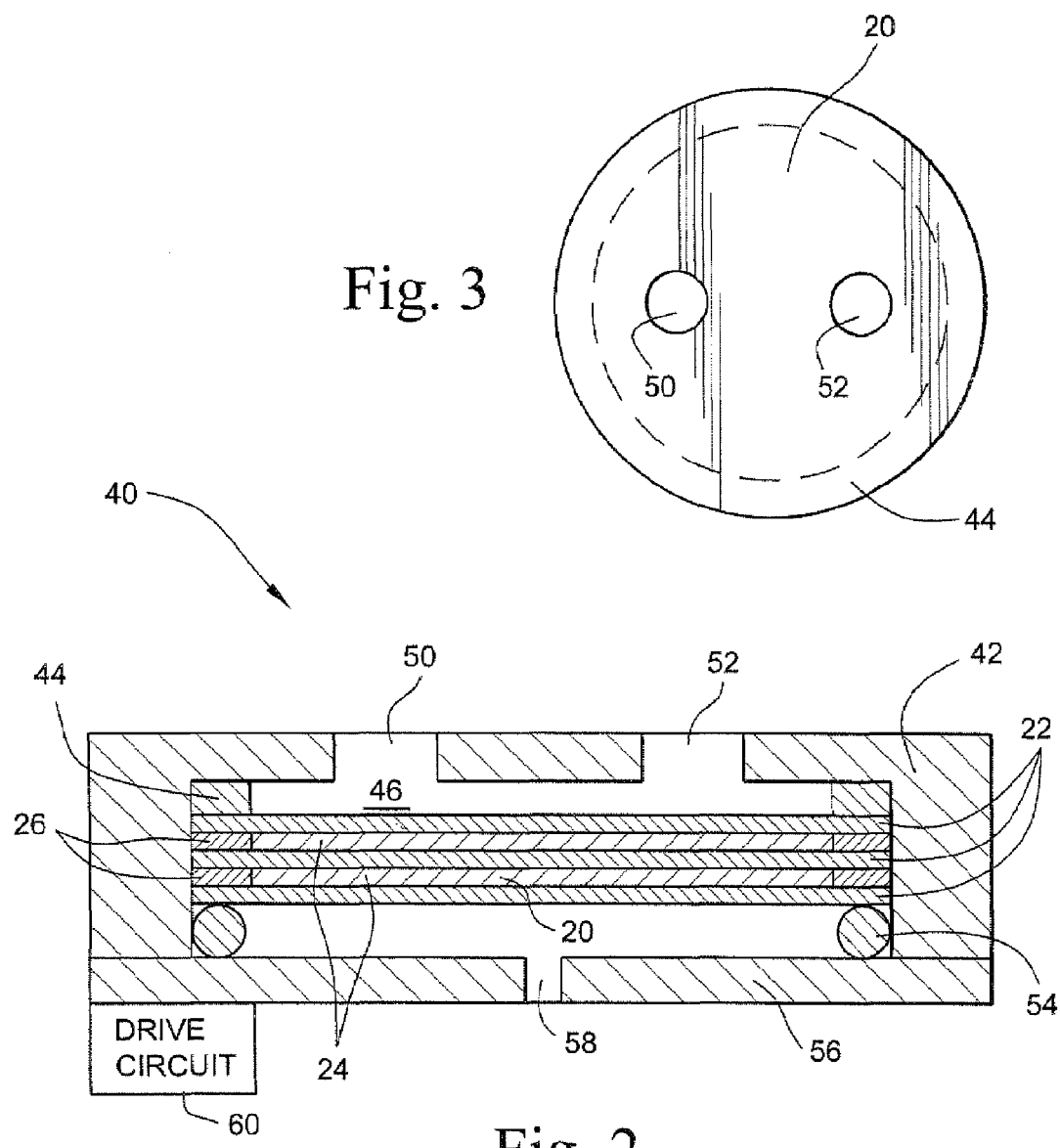
FIG. 2 is a vertical cross section view of an example embodiment of a pump which incorporates the piezoelectric diaphragm assembly of FIG. 1.

FIG. 2 shows an illustrative embodiment of an example pump 40 which employs the diaphragm assembly 20 of FIG. 1. Stacked piezoelectric diaphragm members 22 can be used as an actuator in pump 40 (for example replacing a single piezoelectric diaphragm). Pump 40 of FIG. 2 comprises pump body 42, which may be essentially cylindrical in shape and have a cavity therein. The diaphragm assembly 20 is inserted into the cavity to bear against a ring or gasket 44 which extends around an interior circumference of the cavity. As such, the gasket 44 essentially defines a thickness of a pump chamber 46, the pump chamber 46 being defined both by the pump body 42 and the inserted diaphragm assembly 20. An inlet port 50 and an outlet port 52 are provided, e.g., in pump body 42 for allowing fluid to enter and exit from pump chamber 46. On a back side of diaphragm assembly 20 (a side of diaphragm assembly 20 which is opposite the pump chamber 46), the diaphragm assembly 20 is retained in the cavity of pump body 42 by a spacer or gasket 54. A pump lid 56 can be provided over the cavity for further retention of diaphragm assembly 20 therein. A vent or access hole 58 can be provided in pump lid 56.

The diaphragm assembly 20 works in conjunction with electrical signals which are applied to the piezoelectric diaphragm members 22 thereof. For example, metal layers of the piezoelectric diaphragm members 22 may comprise electrodes to which the electrical signals are applied. The pump 40 of FIG. 2 shows a drive circuit 60 which generates the drive signals which are applied to the piezoelectric diaphragm members 22 through (unillustrated) electrical leads.

In an example pump having a diaphragm assembly 20 with two piezoelectric diaphragm members 22 and an interface layer 24 of trapped silicone grease, a twelve pound per square inch force was delivered from a pump that otherwise (with one piezoelectric diaphragm member) would deliver a force in the range of seven to eight pounds per square inch. The volume output appeared to remain roughly constant.

Figure 4:
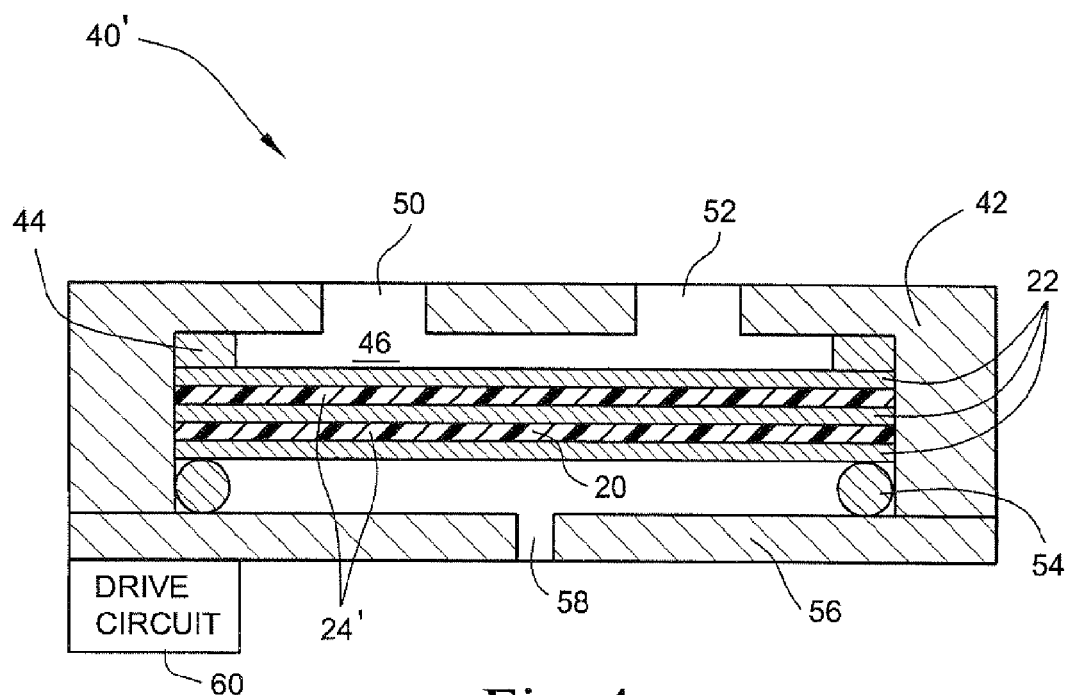
FIG. 4 is a vertical cross section view of an another example embodiment of a pump.

FIG. 4 shows another embodiment of a pump 40' having wherein a plastic film such as polyamide film, teflon, polyurethane, for example, serves as the interface layer 24' each adjacent piezoelectric diaphragm members 22. The stack of pump 40' provides unidirectional advantage and is suitable for applications such as some pumping applications which benefit from increased pressure but do not require more suction. The plastic film can have a disk shape, or any appropriate shape given the desired geometry and configuration (of, e.g., the pump housing). Other elements of the pump 40' of FIG. 4 are essentially the same as those of FIG. 2.

The shape and size of the stack can vary, as can pump features such as pump housing configuration (size, shape, inlet and outlet orientation and positioning, and the like). For example, the stack can comprise piezoelectric members which are circular or disc-shaped, or rectangularly shaped piezoelectric members (e.g., the stack can be a cantilever comprise multiple piezoelectric members having interface layers therebetween).

The drive circuit is not confined to any particular type of circuit. Suitable examples include those described in U.S. patent application Ser. No. 10/816,000, filed Apr. 2, 2004 by Vogeley et al., entitled "Piezoelectric Devices and Methods and Circuits for Driving Same", which is incorporated herein by reference in its entirety, or by documents referenced and/or incorporated by reference therein.

The technology described herein thus advantageously couples multiple piezoelectric diaphragm members in such a way as to yield mechanical actuators that deliver roughly the sum total of the forces of the individual piezoelectric diaphragm members and with minimum loss. In embodiments in which the interface layer is incompressible, the mechanical actuators also have bidirectionally.

Although various embodiments have been shown and described in detail, the claims are not limited to any particular embodiment or example. None of the above description should be read as implying that any particular element, step, range, or function is essential such that it must be included in the claims scope. The scope of patented subject matter is defined only by the claims. The extent of legal protection is defined by the words recited in the allowed claims and their equivalents. It is to be understood that the invention is not to be limited to the disclosed embodiment, but on the contrary, is intended to cover various modifications and equivalent arrangements.

What is claimed is:

1. A diaphragm assembly comprising:
at least two piezoelectric diaphragm members arranged in a stacking direction, each piezoelectric diaphragm member comprising at least a piezoelectric material; an interface layer situated between adjacent piezoelectric diaphragm members, the interface layer in the stacking direction being displaceable and either incompressible or resilient and configured to transmit the force applied by the displacement of a first of the piezoelectric diaphragm members on a first side of the interface layer to a second of the piezoelectric diaphragm members on a second side of the interface layer;
wherein the interface layer comprises a gas.

2. The apparatus of claim 1, wherein a gasket entraps the interface layer between the adjacent piezoelectric diaphragm members.

3. The apparatus of claim 1, wherein each piezoelectric diaphragm member comprises:
a piezoelectric core as the piezoelectric material;
a metal substrate laminated on a first side of the piezoelectric core; and
an outer metal laminated on a second side of the piezoelectric core.

4. The apparatus of claim 1, wherein the interface layer permits lateral movement of the adjacent piezoelectric diaphragm members relative to the interface layer in a direction perpendicular to the stacking direction.

5. The apparatus of claim 1, wherein the interface layer is entrapped between the adjacent piezoelectric diaphragm members.

6. The apparatus of claim 1, wherein the interface layer is configured to lock the two piezoelectric diaphragms together in the stacking direction.

7. The apparatus of claim 1, wherein the interface layer is configured whereby, when the two piezoelectric diaphragm members are activated, the assembly yields approximately a sum total of the forces of individual ones of the two piezoelectric diaphragm members.

8. A diaphragm assembly comprising:
at least two piezoelectric diaphragm members arranged in a stacking direction, each piezoelectric diaphragm member comprising at least a piezoelectric material; an interface layer situated between adjacent piezoelectric diaphragm members, the interface layer in the stacking direction being displaceable and either incompressible or resilient and configured to transmit the force applied by the displacement of a first of the piezoelectric diaphragm members on a first side of the interface layer to a second of the piezoelectric diaphragm members on a second side of the interface layer;

wherein the interface layer comprises an incompressible liquid.

9. The apparatus of claim 8, wherein a gasket entraps the interface layer between the adjacent piezoelectric diaphragm members.

10. The apparatus of claim 8, wherein each piezoelectric diaphragm member comprises:
   a piezoelectric core as the piezoelectric material;
   a metal substrate laminated on a first side of the piezoelectric core; and
   an outer metal laminated on a second side of the piezoelectric core.

11. The apparatus of claim 8, wherein the interface layer permits lateral movement of the adjacent piezoelectric diaphragm members relative to the interface layer in a direction perpendicular to the stacking direction.

12. The apparatus of claim 8, wherein the interface layer is entrapped between the adjacent piezoelectric diaphragm members.

13. The apparatus of claim 8, wherein the interface layer is configured to lock the two piezoelectric diaphragms together in the stacking direction.

14. The apparatus of claim 8, wherein the interface layer is configured whereby, when the two piezoelectric diaphragm members are activated, the assembly yields approximately a sum total of the forces of individual ones of the two piezoelectric diaphragm members.

15. A pump comprising:
   a pump body for at least partially defining a pumping chamber, an inlet port, and an outlet port;
   a diaphragm assembly situated in the pump body, the diaphragm assembly comprising:
      at least two piezoelectric diaphragm members arranged in a stacking direction, each piezoelectric diaphragm member comprising at least a piezoelectric material;
      an interface layer situated between adjacent piezoelectric diaphragm members, the interface layer in the stacking direction being displaceable and incompressible or resilient and configured to transmit the force applied by the displacement of a first of the piezoelectric diaphragm members on a first side of the interface layer to a second of the piezoelectric diaphragm members on a second side of the interface layer;
   wherein the interface layer comprises a compressible gas.

16. The apparatus of claim 15, wherein a gasket entraps the interface layer between the adjacent piezoelectric diaphragm members.

17. The apparatus of claim 15, wherein each piezoelectric diaphragm member comprises:
   a piezoelectric core as the piezoelectric material;
   a metal substrate laminated on a first side of the piezoelectric core; and
   an outer metal laminated on a second side of the piezoelectric core.

18. The apparatus of claim 15, wherein the interface layer permits lateral movement of the adjacent piezoelectric diaphragm members relative to the interface layer in a direction perpendicular to the stacking direction.

19. The apparatus of claim 15, wherein the interface layer is entrapped between the adjacent piezoelectric diaphragm members.

20. The apparatus of claim 15, wherein the interface layer is configured to lock the two piezoelectric diaphragms together in the stacking direction.

21. The apparatus of claim 15, wherein the interface layer is configured whereby, when the two piezoelectric diaphragm members are activated, the assembly yields approximately a sum total of the forces of individual ones of the two piezoelectric diaphragm members.

22. A pump comprising:
   a pump body for at least partially defining a pumping chamber, an inlet port, and an outlet port;
   a diaphragm assembly situated in the pump body, the diaphragm assembly comprising:
      at least two piezoelectric diaphragm members arranged in a stacking direction, each piezoelectric diaphragm member comprising at least a piezoelectric material;
      an interface layer situated between adjacent piezoelectric diaphragm members, the interface layer in the stacking direction being displaceable and incompressible or resilient and configured to transmit the force applied by the displacement of a first of the piezoelectric diaphragm members on a first side of the interface layer to a second of the piezoelectric diaphragm members on a second side of the interface layer;
   wherein the interface layer comprises an incompressible liquid.

23. The apparatus of claim 22, wherein a gasket entraps the interface layer between the adjacent piezoelectric diaphragm members.

24. The apparatus of claim 22, wherein the interface layer is entrapped between the adjacent piezoelectric diaphragm members.

25. The apparatus of claim 22 wherein the interface layer is configured to lock the two piezoelectric diaphragms together in the stacking direction.

26. The apparatus of claim 22, wherein the interface layer is configured whereby, when the two piezoelectric diaphragm members are activated, the assembly yields approximately a sum total of the forces of individual ones of the two piezoelectric diaphragm members.

* * * * *